(12) United States Patent
Sasaki et al.

(10) Patent No.: US 7,208,400 B2
(45) Date of Patent: Apr. 24, 2007

(54) METHOD OF MANUFACTURING A SEMICONDUCTOR DEVICE INCLUDING A DIELECTRIC FILM FORMED BETWEEN FIRST AND SECOND ELECTRODE LAYERS

(75) Inventors: Toshiyuki Sasaki, Kanagawa (JP); Masaki Narita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 10/688,965

(22) Filed: Oct. 21, 2003

(65) Prior Publication Data

US 2005/0023592 A1  Feb. 3, 2005

(30) Foreign Application Priority Data

Jul. 30, 2003  (JP) .............................. 2003-203945

(51) Int. Cl.
*H01L 21/3205* (2006.01)
*H01L 21/4763* (2006.01)

(52) U.S. Cl. ................ 438/587; 438/593; 257/E21.179

(58) Field of Classification Search ................ 438/689, 438/197, 585, 587, 588, 593, 595
See application file for complete search history.

(56) References Cited

U.S. PATENT DOCUMENTS

| 5,185,279 | A  |   | 2/1993 | Ushiku  |         |
|-----------|----|---|--------|---------|---------|
| 6,184,151 | B1 | * | 2/2001 | Adair et al. | 138/743 |
| 6,737,320 | B2 | * | 5/2004 | Chen et al.  | 438/257 |
| 6,774,462 | B2 | * | 8/2004 | Tanaka et al.| 257/639 |
| 2001/0046738 | A1 | * | 11/2001 | Au et al. | 438/261 |
| 2002/0155714 | A1 | * | 10/2002 | Suzuki    | 438/689 |
| 2003/0224574 | A1 | * | 12/2003 | Cho et al.| 438/275 |
| 2003/0235987 | A1 | * | 12/2003 | Doshita   | 438/689 |

FOREIGN PATENT DOCUMENTS

| JP | 3-157937    | 7/1991  |
|----|-------------|---------|
| JP | 5-291567    | 11/1993 |
| JP | 2000-138294 | 5/2000  |
| JP | 2001-168208 | 6/2001  |
| JP | 2001-267301 | 9/2001  |
| JP | 2002-368127 | 12/2002 |
| JP | 2003-37163  | 2/2003  |
| JP | 2003-179169 | 6/2003  |

OTHER PUBLICATIONS

Notification of Reason for Rejection issued by the Japanese Patent Office, mailed Mar. 14, 2006, for Japanese Patent Application No. 203945/2003, and English-language translation thereof.
Decision of Rejection issued by the Japanese Patent Office on Jan. 30, 2007, in Japanese Patent Application No. 2003-203945, and English-language translation thereof.

* cited by examiner

*Primary Examiner*—Scott B. Geyer
(74) *Attorney, Agent, or Firm*—Finnegan, Henderson, Farabow, Garrett & Dunner, L.L.P.

(57) ABSTRACT

There are provided a gate dielectric film formed on a semiconductor substrate; a gate electrode including: a first electrode layer formed on the gate dielectric film, a dielectric film having a thickness of 5 Å or more and 100 Å or less, and formed on the first electrode layer, and a second electrode layer formed on the dielectric film; and a source and drain regions formed in the semiconductor substrate at both sides of the gate electrode.

16 Claims, 8 Drawing Sheets

METHOD OF MANUFACTURING A SEMICONDUCTOR DEVICE INCLUDING A DIELECTRIC FILM FORMED BETWEEN FIRST AND SECOND ELECTRODE LAYERS

CROSS-REFERENCE TO RELATED APPLICATIONS

This application is based upon and claims the benefit of priority from prior Japanese Patent Application No. 2003-203945, filed on Jul. 30, 2003 in Japan, the entire contents of which are incorporated herein by reference.

BACKGROUND OF THE INVENTION

1. Field of the Invention

The present invention relates to a semiconductor device and a method of manufacturing the same.

2. Related Art

A conventional method of manufacturing a semiconductor device including a MISFET will be described below with reference to FIGS. 13 and 14.

First, a gate dielectric film 4 of silicon oxide ($SiO_2$) is formed on a silicon monocrystal substrate 2 (FIG. 13). Subsequently, a polycrystalline silicon layer is formed on the gate dielectric film 4. Then, phosphorus or arsenic is doped into the polycrystalline silicon layer in a region where an n-channel MOSFET is to be formed, thereby forming an n-type polycrystalline silicon layer 9. At this time, regions other than the region where an n-channel MOSFET is formed are covered by, e.g., a photoresist pattern (not shown).

After the aforementioned resist pattern is removed, another resist pattern (not shown) of, e.g., a photoresist, is formed, the resist pattern having an opening in a region where a p-channel MOSFET is to be formed. Then, boron is doped into the polycrystalline silicon layer in the region where a p-channel MOSFET is to be formed using the resist pattern as a mask, thereby forming a p-type polycrystalline silicon layer 12. Subsequently, the resist pattern is removed.

Thereafter, a resist pattern 14 serving as an etching mask is formed on the polycrystalline silicon layers 9 and 12, the resist pattern 14 having openings at regions other than the regions where gate electrodes are to be formed. A photoresist layer formed by using a photolithography technique is used to form the resist pattern 14.

Next, the silicon monocrystal substrate 2 is carried into a reactive ion etching (RIE) apparatus so as to perform the dry etching of the polycrystalline silicon layers 9 and 12. Generally, a halogen type etching gas, such as hydrogen bromide (HBr) gas, chlorine ($Cl_2$) gas, etc., is used to perform the dry etching (JP Laid-Open Pub. No. 2003-37163). When the etching of the polycrystalline silicon layers 9 and 12 at the bottom of the openings of the resist pattern 14 is started, thin-film removing (etching) is performed from the surface of the polycrystalline silicon layers 9 and 12 in the thickness direction thereof. As a result, the surface of the gate dielectric film 4 is exposed, and the remaining portions of the polycrystalline silicon layers 9 and 12 become gate electrodes 10 and 13, respectively.

Ideally, at this time the etching on the entire surface of the gate dielectric film 4 is stopped. However, since the gate dielectric film 4 is very thin, and a halogen type etching gas cannot secure sufficient etching selectivity with respect to the gate dielectric film 4, it is likely that part of the gate dielectric film 4 is overetched to the degree that an opening is made therethrough.

In order to prevent this, generally, the etching of the polycrystalline silicon layers 9 and 12 is monitored using, e.g., an interference type layer-thickness monitor, and the etching is suspended before reaching the gate dielectric film 4, e.g., when the thickness of the polycrystalline layers 9 and 12 becomes 200 Å to 300 Å. Then, a second etching is performed by using an etching gas having a sufficient etching selectivity with respect to the gate dielectric film 4, such as $O_2$-added HBr gas. The second etching is continued until the gate dielectric film 4 is exposed. During the second etching, the light emission intensity of the silicon reaction product in the polycrystalline silicon layers 9 and 12 is monitored, and the termination of the second etching is decided when the light emission intensity is decreased.

After the etching is completed, the gate electrodes 10 and 13, to which impurities are doped to make them either n-type or p-type, are formed.

Generally, the etching rate of the n-type polycrystalline silicon layer 9 differs from that of the p-type polycrystalline silicon layer 12. Accordingly, in most of the cases, the gate dielectric film 4 in the region where the n-type polycrystalline silicon layer 9 is formed is exposed earlier than the gate dielectric film 9 in the region where the p-type polycrystalline silicon layer 12 is formed during the first and second etching steps. As a result, the gate dielectric film 4 could be overetched, exposing the silicon monocrystal substrate 2 around the gate electrodes 10 formed of the n-type polycrystalline silicon, as shown in FIG. 15. In addition, the gate electrodes 13 formed of the p-type polycrystalline silicon may be insufficiently etched and have a lip portion at the lower end thereof, as shown in FIG. 15. Thus, the gate length of the n-type gate electrode 10 at the interface with the gate dielectric film 4 may differ from that of the p-type gate electrode 13.

Generally, etching rates may vary at different places on a surface of a polycrystalline silicon layer since plasma density distribution in a reactive ion etching apparatus may become uneven, or active species may be unevenly inserted into a polycrystalline silicon layer that becomes a gate electrode. Accordingly, the etching rate at the edge portions of the polycrystalline silicon substrate may be faster than the etching rate at the central portion thereof, resulting in that the gate dielectric film 4 might be overetched, exposing its base layer around the gate electrodes formed at the edge portions, and the gate electrodes formed at the central area may have a lip portion.

Further, the etching rate may vary depending on the density of the formed pattern. The etching rate of a gate electrode 20 shown in FIG. 16, which is spatially isolated, may be faster than the etching rate of gate electrodes 21, which are densely formed. Thus, the gate dielectric film 4 may be excessively etched around the gate electrode 20, or the shape of gate electrode 20 may be affected negatively.

SUMMARY OF THE INVENTION

A semiconductor device according to the first aspect of the present invention includes: a gate dielectric film formed on a semiconductor substrate; a gate electrode including: a first electrode layer formed on the gate dielectric film; a dielectric film having a thickness of 5 Å or more and 100 Å or less, and formed on the first electrode layer; and a second electrode layer formed on the dielectric film; and a source and drain regions formed in the semiconductor substrate at both sides of the gate electrode.

A method of manufacturing a semiconductor device according to the second aspect of the present invention includes: forming a gate dielectric film on a semiconductor substrate; forming a first electrode material layer on the gate dielectric film; forming a dielectric film having a thickness of 5 Å or more and 100 Å or less on the first electrode material layer; forming a second electrode material layer on the dielectric film; forming a pattern on the second electrode material layer; etching the second electrode material layer using the pattern as a mask, thereby exposing the dielectric film; etching the dielectric film; and etching the first electrode material layer, thereby forming a gate electrode.

DESCRIPTION OF THE EMBODIMENTS

Hereinafter, an embodiment of the present invention will be described with reference to the accompanying drawings.

Figure 1:
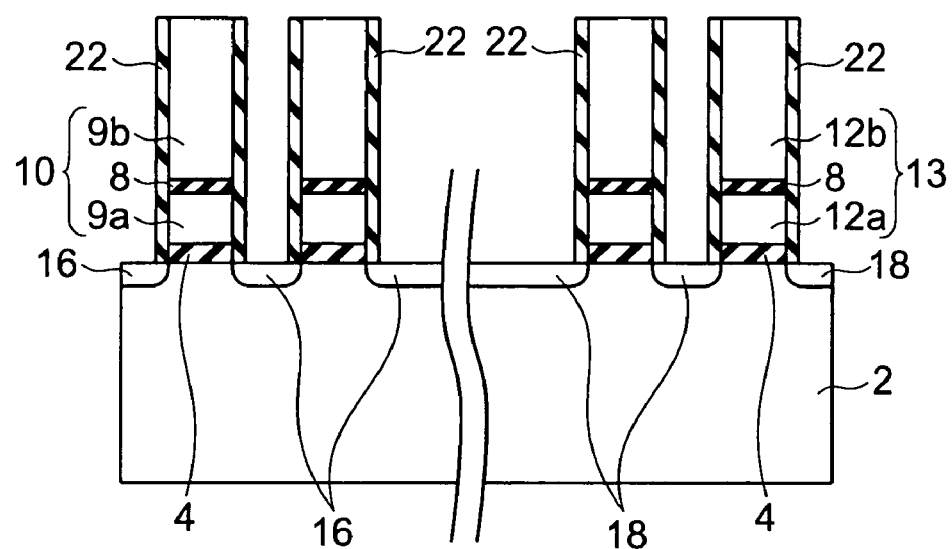
FIG. 1 is a sectional view showing the structure of a semiconductor device according to a first embodiment of the present invention.

FIG. 1 shows the structure of a semiconductor device according to a first embodiment of the present invention, which includes an insulated gate field effect transistor (MISFET).

A gate electrode 10 is formed on a semiconductor substrate 2 with a gate dielectric film 4 located therebetween in a region where an n-channel MOSFET is to be formed. N-type impurity diffusion regions 16 that are to become a source and a drain are formed in the semiconductor substrate 2 at both sides of the gate electrode 10. The gate electrode 10 has a three-layer laminated structure including a first electrode layer 9a of polycrystalline silicon formed on the gate dielectric film 4, a thin dielectric film 8 formed on the first electrode layer 9a, and a second electrode layer 9b formed on the dielectric film 8. Either phosphorus or arsenic is doped to the first and second electrode layers 9a and 9b.

A gate electrode 13 is formed on the semiconductor substrate 2 with the gate dielectric film 4 located therebetween in a region where a p-channel MOSFET is to be formed. P-type impurity diffusion regions 18 that are to become a source and a drain are formed in the semiconductor substrate 2 at both sides of the gate electrode 13. The gate electrode 13 has a three-layer laminated structure including a first electrode layer 12a of polycrystalline silicon formed on the gate dielectric film 4, a thin dielectric film 8 formed on the first electrode layer 12a, and a second electrode layer 12b formed on the dielectric film 8. Boron is doped into the first and second electrode layers 12a and 12b. Gate sidewalls 22 are formed at the sides of the gate electrodes 10 and 13.

It is preferable that the absolute value of the thickness of the dielectric film 8 is about 5 Å or more, and 100 Å or less, and that the relative value of the thickness of the dielectric film 8 is 0.5%–10% of the thickness of the gate electrodes 10 and 13. If the dielectric film 8 were thinner than these values, the dielectric film 8 would not suitably serve as an etching stopper when a semiconductor device according to this embodiment is manufactured. On the contrary, if the dielectric film 8 were thicker than these values, impurities could not be sufficiently doped into the first electrode layers 9a and 12a at the time of ion implantation, thereby substantially increasing the thickness of the gate dielectric film. Further, it is preferable that the dielectric film 8 is located within 500 Å from the gate dielectric film 4, and is located at a height about ¼ or less of the thickness of the gate electrodes 10 and 13 from the gate dielectric film 4. If the dielectric film 8 were located too high, the lower portion of the first electrode layer 12a would have a lip portion as in the case of the conventional devices.

The material of the dielectric film 8 can be silicon oxide ($SiO_2$), silicon nitride (SiN), or silicon oxynitride ($SiO_xN_y$), or a combined layer formed by laminating at least two of a silicon oxide layer, a silicon nitride layer, and a silicon oxynitride layer. As will be described in detail later, the dielectric film 8 is used as an etching stopper. Accordingly, it is preferable that silicon oxide, which has a relatively high etching selectivity, is used for the dielectric film 8. In addition, as will be described later, the silicon oxide layer can be a thermally oxidized layer or a natural oxide layer.

The gate electrodes 10 and 13 can be formed by sandwiching the dielectric film 8 with silicon germanium instead of polycrystalline silicon. Alternatively, they can have a three-layer laminated structure including a polycrystalline silicon layer, the dielectric film 8, and a silicon germanium layer.

Next, a method of manufacturing a semiconductor device according to this embodiment will be described with reference to FIGS. 2 to 9.

Figure 2:
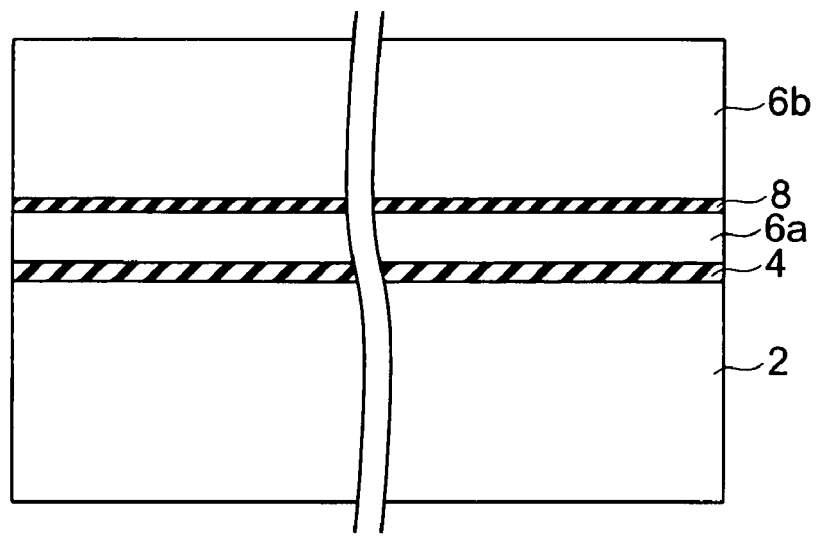
FIG. 2 is a sectional view showing a step of a process of manufacturing the semiconductor device shown in FIG. 1.

First, a semiconductor substrate 2 of silicon monocrystal is prepared. The semiconductor substrate 2 is in of a semiconductor wafer form before being subjected to dicing. A gate dielectric film 4 is formed on the entire surface of the semiconductor substrate 2 (FIG. 2). For example, a silicon oxide layer formed by thermal oxidation can be used as the gate dielectric film 4. Alternatively, a single layer such as a silicon nitride layer, silicon oxynitride layer, etc., or a combined layer including at least two of a silicon oxide layer, a silicon nitride layer, and a silicon oxynitride layer can be used.

A first gate electrode material layer 6a is formed on the gate dielectric film 4. A polycrystalline silicon layer or a silicon germanium layer formed by using a CVD (Chemical Vapor Deposition) technique can be used as the gate electrode material layer 6a. Thereafter, a dielectric film 8 of silicon oxide, to serve as an etching stopper, is formed on the gate electrode material layer 6a by a thermal oxidation technique. Although in this case the dielectric film 8 of silicon oxide is formed by thermal oxidation, a natural oxide layer remaining on the surface of the polycrystalline silicon layer or the silicon germanium layer after the formation of the first electrode material layer 6a can be used as the dielectric film 8. In addition, a single layer such as a silicon nitride layer, a silicon oxynitride layer, etc., or a combined layer obtained by combining at least two of a silicon oxide layer, a silicon nitride layer, and a silicon oxynitride layer can be used as the dielectric film 8.

Then, a second gate electrode material layer 6b is formed on the dielectric film 8. For example, a silicon polycrystalline layer or silicon germanium layer formed by the CVD method can be used as the second gate electrode material layer 6b.

Figure 3:
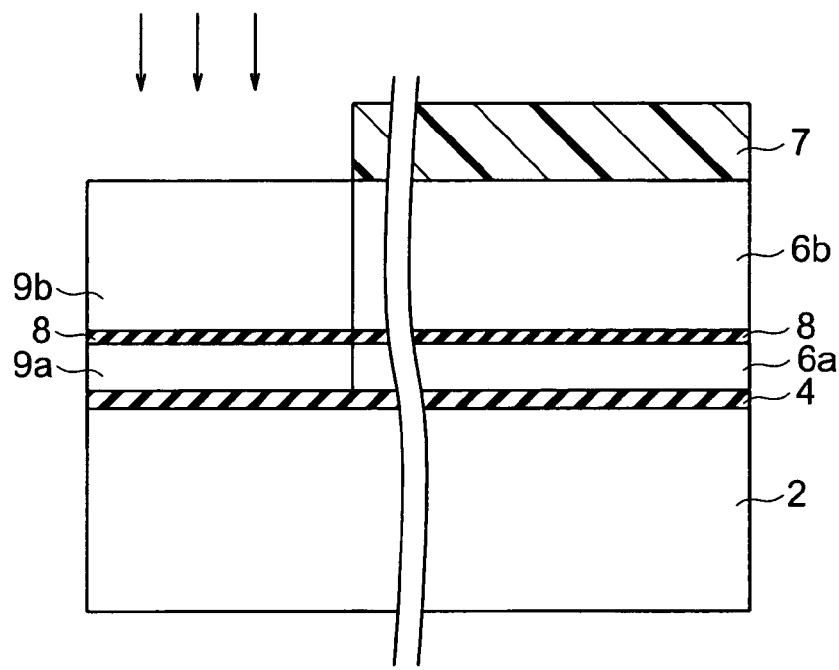
FIG. 3 is a sectional view showing a step of the process of manufacturing the semiconductor device shown in FIG. 1.

Subsequently, a resist pattern 7 of a photoresist is formed on the gate electrode material layer 6b, the resist pattern 7 having an opening in a region where an n-channel MOSFET is to be formed, as shown in FIG. 3. Then, phosphorus or arsenic is doped into the first and second gate electrode material layers 6a and 6b by ion implantation using the resist pattern 7 as a mask, thereby forming n-type first and second gate electrode layers 9a and 9b. Thereafter, the resist pattern 7 is removed by the ashing technique using, e.g., $O_2$ gas.

Figure 4:
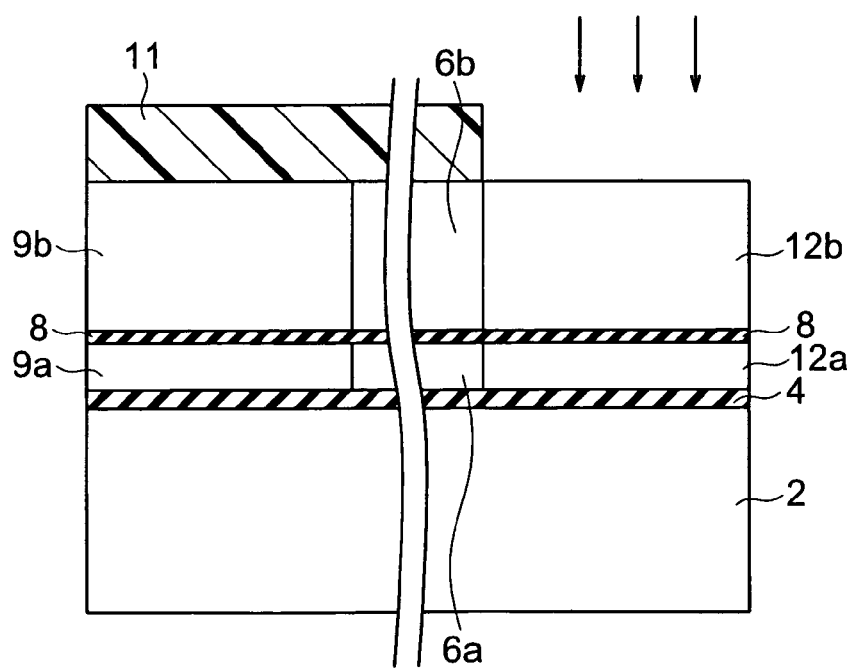
FIG. 4 is a sectional view showing a step of the process of manufacturing the semiconductor device shown in FIG. 1.

Then, as shown in FIG. 4, a resist pattern 11 of, e.g., a photoresisit is formed on the gate electrode material layer 6b, the resist pattern 11 having an opening in a region where a p-channel MOSFET is to be formed. Subsequently, boron is doped into the first and second gate electrode material layers 6a and 6b by ion implantation using the resist pattern 11 as a mask, thereby forming p-type first and second gate electrode material layers 12a and 12b. Thereafter, the resist pattern 11 is removed by the ashing technique using e.g., $O_2$ gas.

Figure 5:
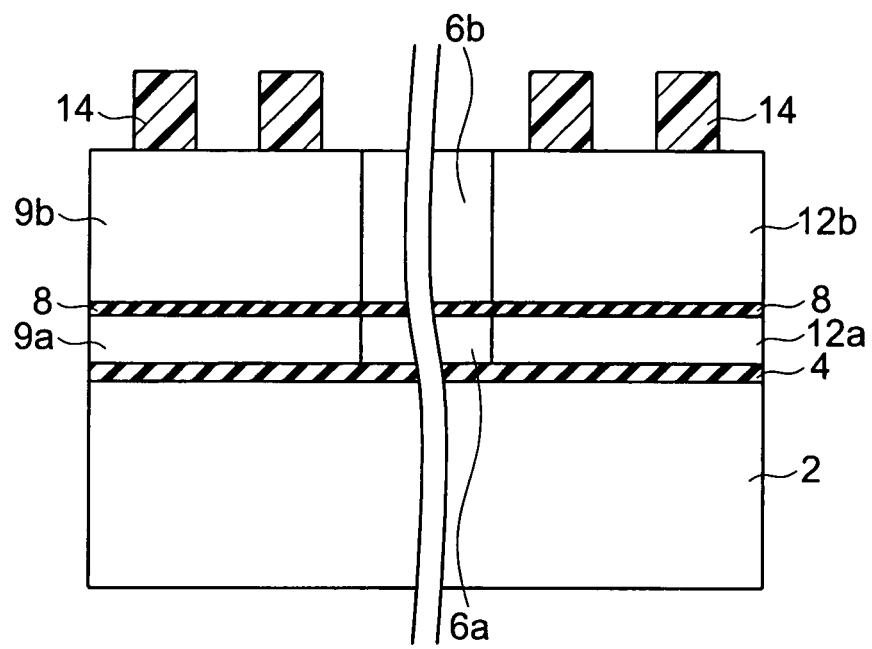
FIG. 5 is a sectional view showing a step of the process of manufacturing the semiconductor device shown in FIG. 1.

Thereafter, a resist pattern 14 of, e.g., a photoresist, is formed on the n-type second gate electrode material layer 9b and the p-type second gate electrode material layer 12b, as shown in FIG. 5.

Figure 6:
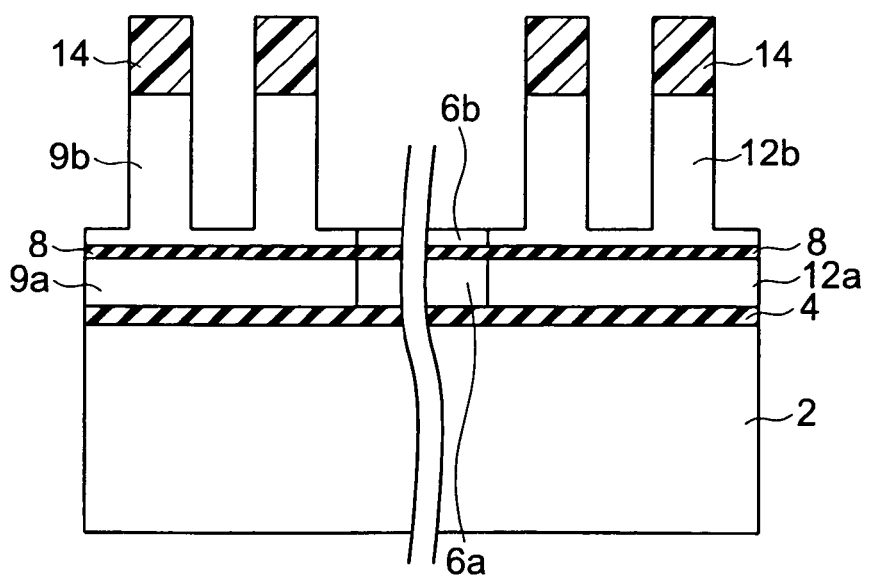
FIG. 6 is a sectional view showing a step of the process of manufacturing the semiconductor device shown in FIG. 1.

Then, the semiconductor substrate 2 on which the resist pattern 14 is formed is carried into the reactive ion etching apparatus where the first etching step is executed, i.e., the first reactive ion etching is performed on the second gate electrode material layers 9b and 12b. As shown in FIG. 6, during the first etching step, the resist pattern 14 is used as a mask and reactive ion etching is performed by using, e.g., a mixed gas containing HBr gas and $Cl_2$ gas. At this time, the thickness of the gate electrode material layers is monitored in real time by an interference type end point detector in order to stop etching before reaching the dielectric film 8 serving as an etching stopper. It is possible to stop etching before reaching the dielectric film 8 without using the interference type end point detector during the first etching step by, e.g., measuring the etching time, and by stopping etching after a certain period of time has passed, which is determined by the etching rate of the gate electrode material measured in advance.

Although a mixed gas containing HBr gas and $Cl_2$ gas is used during the first etching step, a mixed gas containing HBr gas, $N_2$ gas, and $CF_4$ gas, a mixed gas containing HBr gas, $N_2$ gas, and $NF_3$ gas, a mixed gas containing HBr gas, $N_2$ gas, and $CHF_3$ gas, or HBr gas alone can also be used.

There is a case where a natural oxide layer is formed on the surface of the second gate electrode material layers 9b and 12b after the resist pattern 14 is formed and before the workpiece is carried into the reaction chamber. In such a case, it is necessary to remove the natural oxide layer before starting etching the second gate electrode material layers 9b and 12b. The removal of the natural oxide layer can be performed by using any one of $CF_4$ gas, $SF_6$ gas, $NF_3$ gas, and $CHF_3$ gas.

Figure 7:
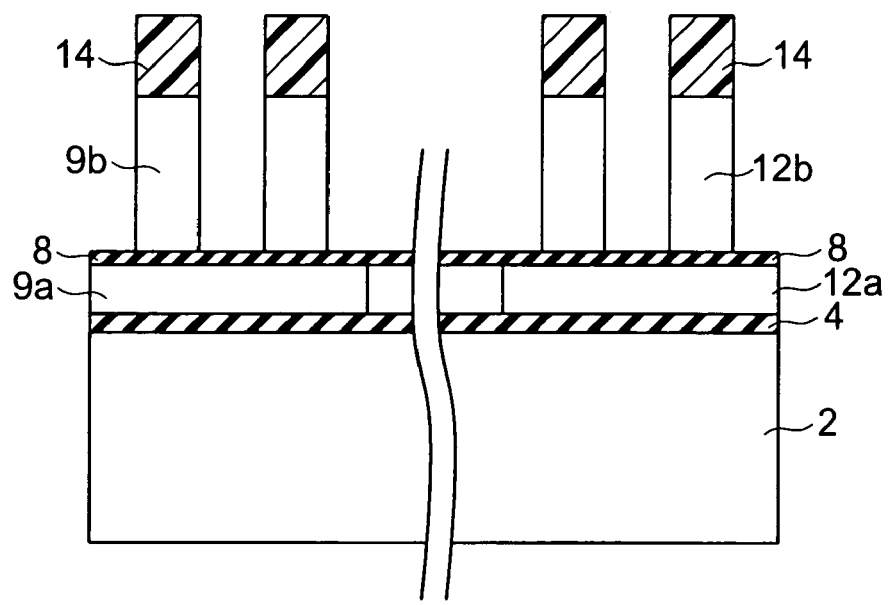
FIG. 7 is a sectional view showing a step of the process of manufacturing the semiconductor device shown in FIG. 1.

After the first etching step is completed, the second etching step is performed using the resist pattern 14 as a mask. During the second etching step, the remaining portions of the gate electrode layers 9b and 12b are etched so as to completely expose the dielectric film 8 (FIG. 7). The etching gas used in this case must have a sufficient etching selectivity with respect to the dielectric film 8, such as a mixed gas containing HBr gas, $Cl_2$ gas, and $O_2$ gas. The $O_2$ gas is used to improve the etching selectivity with respect to the dielectric film 8. Although a mixed gas containing HBr gas, $Cl_2$ gas, and $O_2$ gas is used in this embodiment, only HBr gas, or a mixed gas containing HBr gas and $O_2$ gas can be used instead. The end point of the second etching step can be detected in real time by monitoring the light emission intensity of the silicon reaction product of the gate electrode material layers 9b and 12b.

Although the second gate electrode material layers 9b and 12b are etched to expose the dielectric film 8 during the first and second etching steps in this embodiment, the etching of the second gate electrode material layers 9b and 12b can be performed during a single etching step. In such a case, only HBr gas, or a mixed gas containing HBr gas and $O_2$ gas, can be used as the etching gas.

Figure 8:
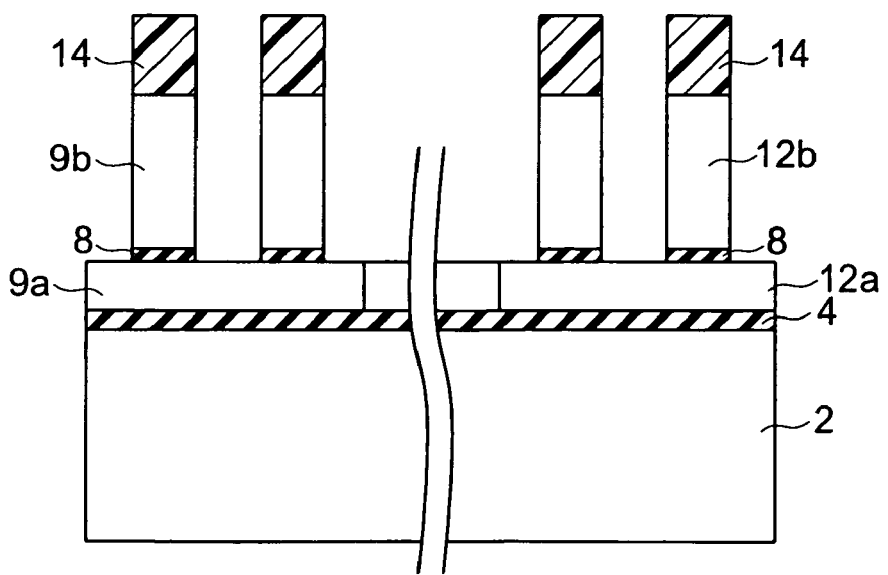
FIG. 8 is a sectional view showing a step of the process of manufacturing the semiconductor device shown in FIG. 1.

Then, the third etching step is carried out to remove the dielectric film 8 by using any one of a fluorine containing gas, such as $CF_4$ gas, $SF_6$ gas, $NF_3$ gas, $CHF_3$ gas, etc (FIG. 8). Since the dielectric film is very thin, the third etching step is carried out for a very short time, e.g., a few seconds.

Figure 9:
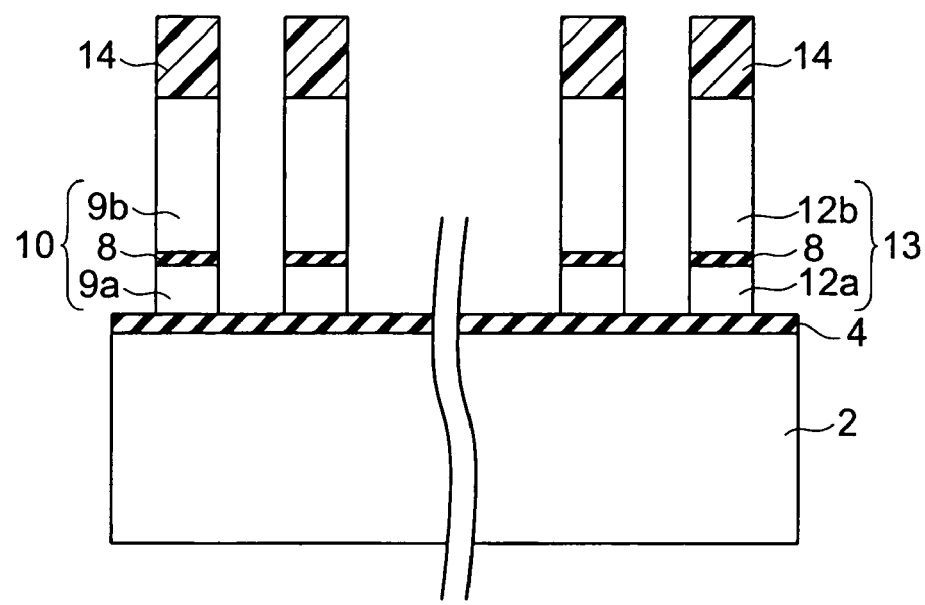
FIG. 9 is a sectional view showing a step of the process of manufacturing the semiconductor device shown in FIG. 1.

Then, the fourth etching step is carried out to etch the first gate electrode material layers 9a and 12a in order to expose the gate dielectric film 4 (FIG. 9). An etching gas having a sufficient etching selectivity with respect to the gate dielectric film 4, such as a mixed gas containing HBr gas, $Cl_2$ gas, and $O_2$ gas is used in this case. The $O_2$ gas is used to improve the etching selectivity with respect to the gate dielectric film 4. Although a mixed gas containing HBr gas, $Cl_2$ gas, and $O_2$ gas is used in this embodiment, a mixed gas containing HBr gas and $O_2$ gas, or HBr gas alone can be used instead. When only HBr gas is used as the etching gas, it is preferable that the pressure of the etching gas be increased in order to obtain a sufficient etching selectivity with respect to the gate dielectric film 4.

The end point of the fourth etching step can be detected in real time by monitoring the light emission intensity of the silicon reactive product generated from the gate electrode material layers 9a and 12a.

After the gate dielectric film 4 is exposed, the fifth etching step is carried out to remove the residue of the first gate electrode material layers 9a and 12a by using a mixed gas containing HBr gas, $O_2$ gas, and $N_2$ gas. As a result, a gate electrode 10 including the gate electrode material layers 9a and 9b, to which an n-type impurity has been doped, and the dielectric film 8 sandwiched therebetween is formed in a region where an n-channel MOSFET is to be formed, as shown in FIG. 9. Further, a gate electrode 13 including the gate electrode material layers 12a and 12b, to which a p-type impurity has been doped, and the dielectric film 8 sandwiched therebetween is formed in a region where a p-channel MOSFET is to be formed. Although a mixed gas containing HBr gas, $O_2$ gas, and $N_2$ gas is used in the fifth etching step, a mixed gas containing HBr gas and $O_2$ gas, or a mixed gas containing HBr gas, $O_2$ gas, and $Cl_2$ gas can be used instead. After the fifth etching step is completed, the resist pattern 14 is removed. During the fourth and fifth etching steps, the shape of the gate electrodes 10 and 13 is trimmed.

Figure 10:
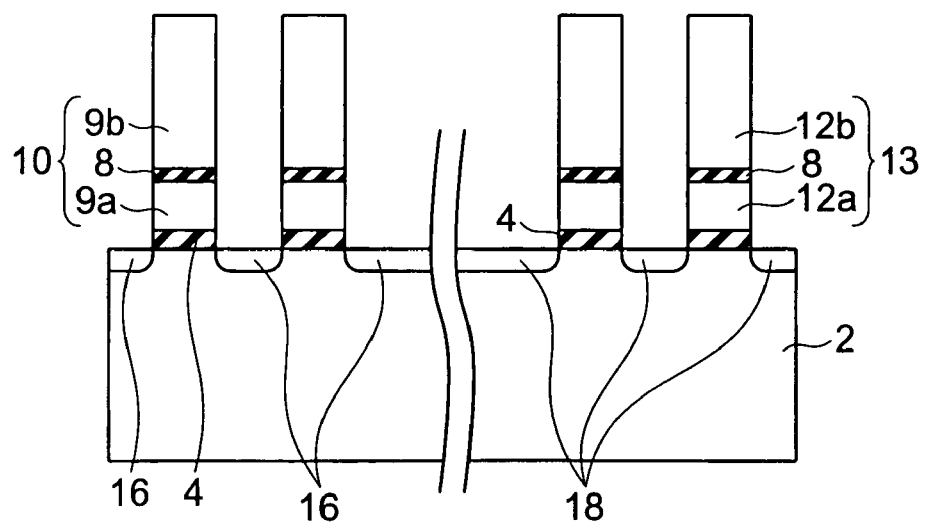
FIG. 10 is a sectional view showing a step of the process of manufacturing the semiconductor device shown in FIG. 1.

Thereafter, as shown in FIG. 10, wet etching is performed to leave the gate dielectric film 4 only at the portions immediately below the gate electrodes 10 and 13. Then, a resist pattern (not shown) is formed, the resist pattern having an opening in a region where an n-type MOSFET is to be formed. Impurity diffusion regions 16 that are to become a source and a drain are formed in the semiconductor substrate 2 at both sides of the gate electrode 10 through the ion implantation of an n-type impurity, e.g., phosphorous or arsenic using the resist pattern as a mask. Then, another resist pattern (not shown) is formed, the resist pattern having an opening in a region where a p-type MOSFET is to be formed. Impurity diffusion regions 18 that are to become a source and a drain are formed in the semiconductor substrate 2 at both sides of the gate electrode 13 through the ion implantation of a p-type impurity, e.g., boron, using the resist pattern as a mask. Although the impurity diffusion regions 16 and 18 are formed after etching the gate dielectric film 4 in this embodiment, the gate electric film 4 can be etched after formation of the impurity diffusion regions 16 and 18. Furthermore, when forming the impurity diffusion layers 16 and 18, the formation of the impurity diffusion layer 18 can be performed first.

After the gate dielectric film 4 is etched and the impurity diffusion regions 16 and 18 are formed, a dielectric film formed of a $SiO_2$ layer, a SiN layer, or a laminated layer including these layers, is formed so as to cover the gate electrodes 10 and 13. Then, the etch back of the dielectric film is performed so that the dielectric film is left only at the side portions of the gate electrodes 10 and 13, as shown in FIG. 1, thereby forming the gate side walls 22.

As described above, according to this embodiment, it is possible to suspend the etching process at the dielectric film 8 since a gas having a sufficient etching selectivity with respect to the dielectric film 8 is used during the second etching step. Because of this, the difference in etching amount caused by whether an n-type impurity is doped or a p-type impurity is doped is adjusted, thereby substantially evening the etching amount or the remainder amount of the first gate electrode material layers 9a and 12a. Thus, the gate dielectric film is prevented from being overetched locally, the shape of the gate electrode is prevented from being degraded, and the gate length is prevented from fluctuating.

Figure 11:
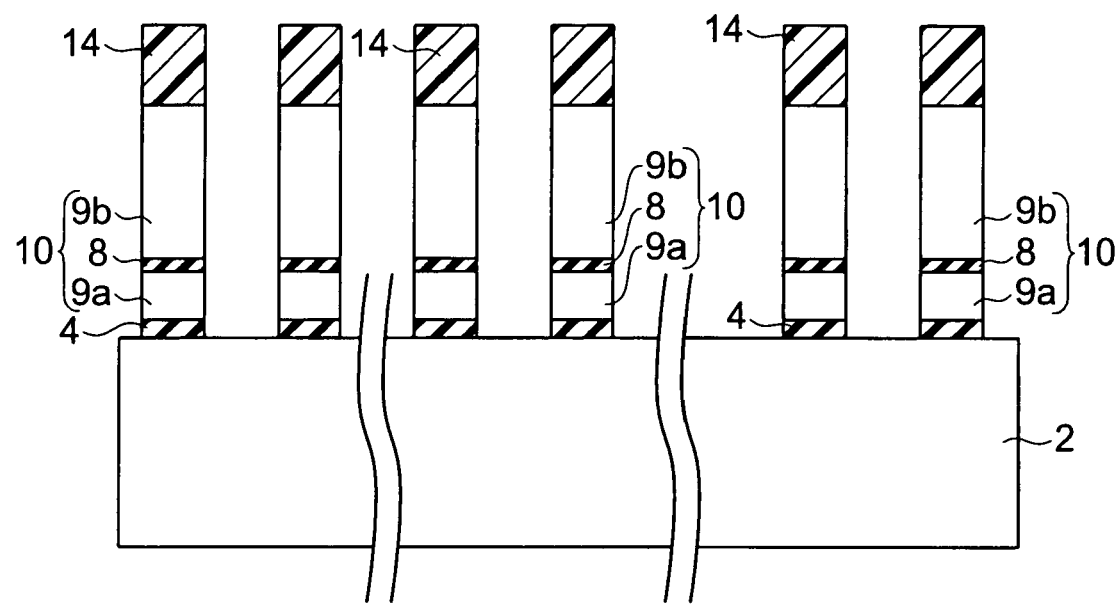
FIG. 11 is a sectional view showing the structure of a semiconductor device manufactured according to a first modification of the first embodiment.

In the aforementioned embodiment, the difference in etching amount caused by whether an n-type impurity is doped or a p-type impurity is doped is adjusted. However, the difference in etching amount caused by whether the gate electrode is located at the edge portion or the central portion, i.e., caused by the location of gate electrodes in the semiconductor substrate, can be adjusted by using the aforementioned process of manufacture, as shown in FIG. 11. Thus, it is possible to make the etching amount or the remainder amount of the gate electrode material layer 9a substantially even at the time when the gate dielectric film 4 is exposed. Therefore, the gate dielectric film is prevented from being overetched locally, the shape of the gate electrode is prevented from being degraded, and the gate length is prevented from fluctuating.

Figure 12:
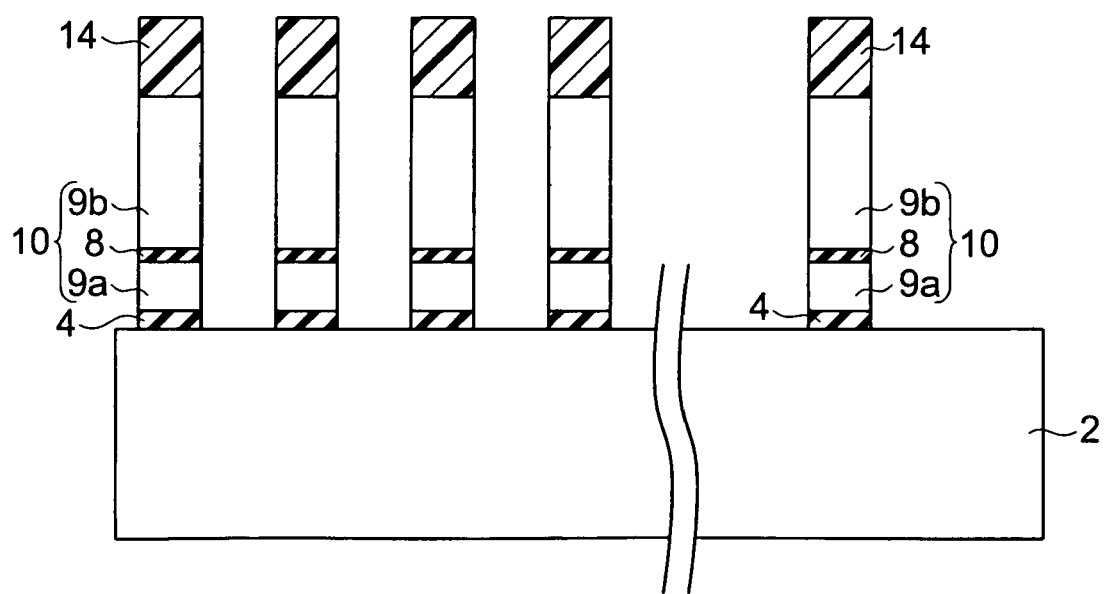
FIG. 12 is a sectional view showing the structure of a semiconductor device manufactured according to a second modification of the first embodiment.
Figure 13:
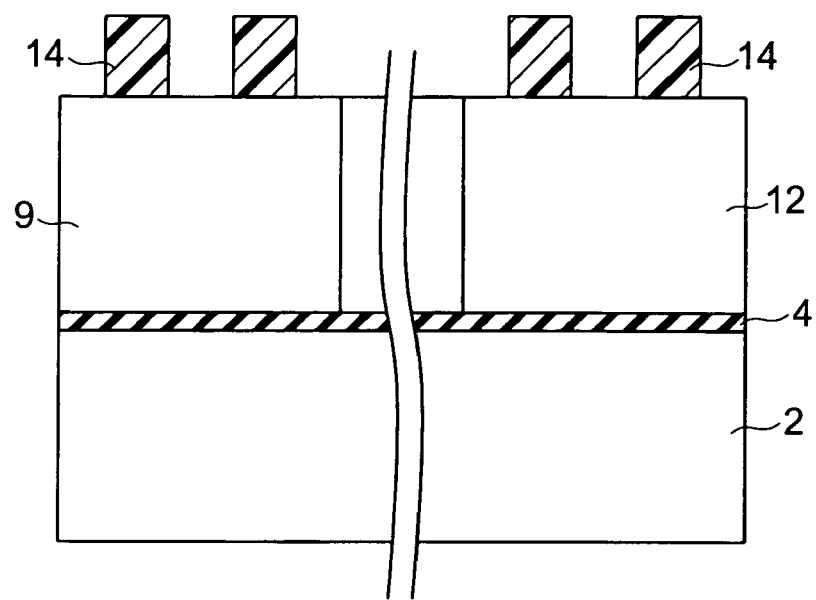
FIG. 13 is a sectional view showing a step of a conventional process of manufacturing a semiconductor device.
Figure 14:
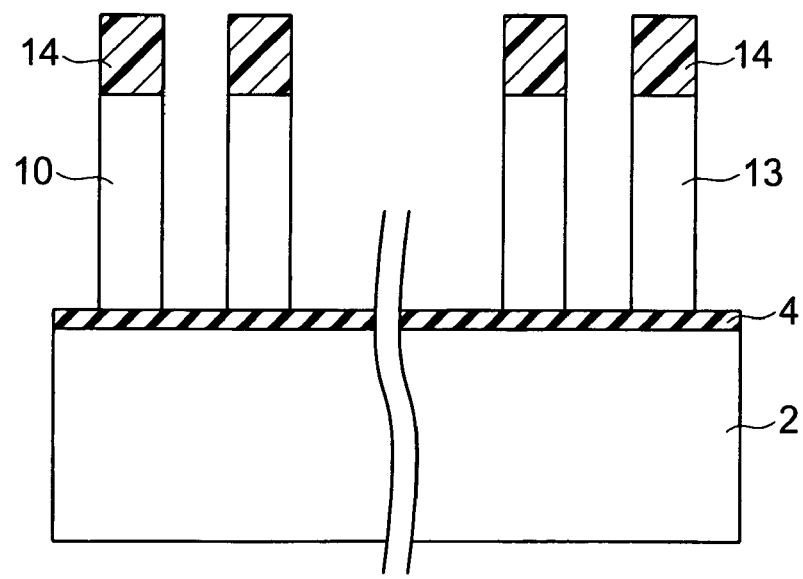
FIG. 14 is a sectional view showing a step of the conventional process of manufacturing a semiconductor device.
Figure 15:
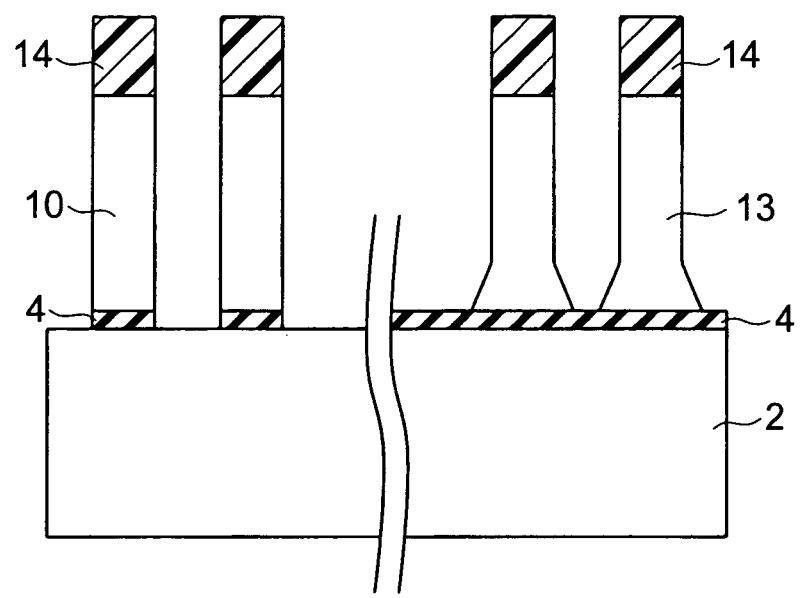
FIG. 15 is a sectional view for explaining a problem inherent with the conventional manufacturing process.
Figure 16:
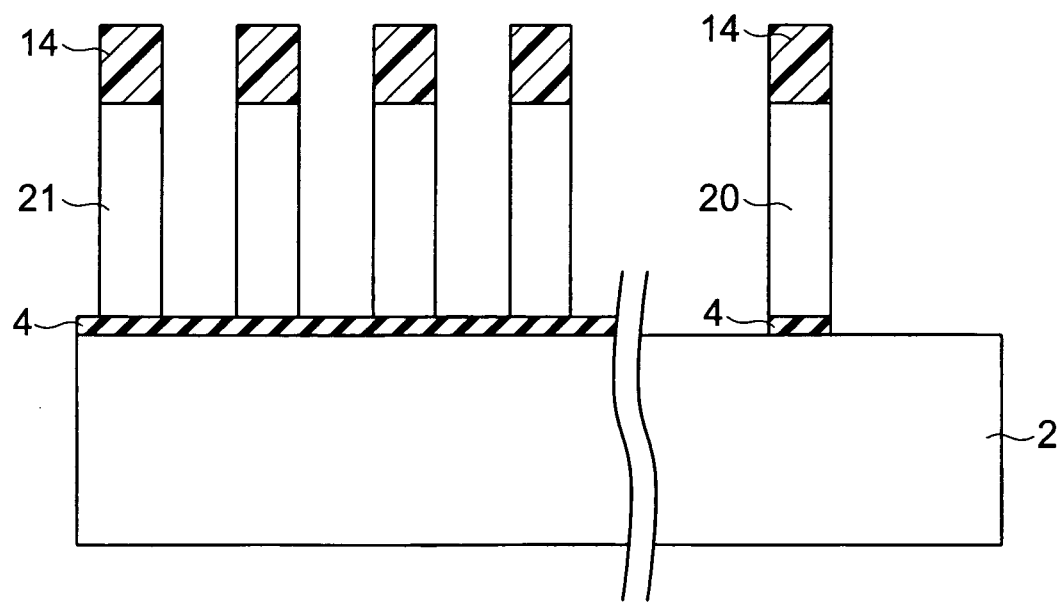
FIG. 16 is a sectional view for explaining a problem inherent with the conventional manufacturing process.

Furthermore, the difference in etching amount caused by whether the gate electrode pattern is dense or not can be adjusted by using the aforementioned process of manufacture, as shown in FIG. 12. Thus, it is possible to make substantially even the etching amount or the remainder amount of the gate electrode material layer 9a at the time when the gate dielectric film 4 is exposed. Therefore, the gate dielectric film is prevented from being overetched locally, the shape of the gate electrode is prevented from being degraded, and the gate length is prevented from fluctuating.

As described above, according to the embodiment of the present invention, the gate dielectric film is prevented from being overetched locally, the shape of the gate electrode is prevented from being degraded, and the gate length is prevented from fluctuating.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method of manufacturing a semiconductor device comprising:
    forming a first dielectric film on each of first and second regions in a semiconductor substrate;
    forming first and second stack films on the first dielectric film of the first and second regions respectively, each of the first and second stack films having a first electrode material layer, a second dielectric film having a thickness of 5 Å or more and 100 Å or less, and a second electrode material layer, an etching rate of the first and second electrode material layers of the first stack film being different from an etching rate of the first and second electrode material layers of the second stack film;
    forming a pattern on the first and second stack films;
    etching the second electrode material layer of each of the first and second stack films using the pattern as a mask, thereby exposing the second dielectric film of each of the first and second stack films;
    etching the second dielectric film of each of the first and second stack films; and
    etching the first electrode material layer of each of the first and second stack films, thereby forming a gate electrode in each of the first and second regions.

2. The method of manufacturing a semiconductor device according to claim 1, wherein the second electrode material layer is formed of polycrystalline silicon or silicon germanium, to which an impurity is doped.

3. The method of manufacturing a semiconductor device according to claim 1, wherein the etching of the second electrode material layer to expose the second dielectric film is performed by using HBr gas or a mixed gas containing HBr gas and $O_2$ gas as an etching gas.

4. The method of manufacturing a semiconductor device according to claim 1, wherein the etching of the second electrode material layer includes:
    etching the second electrode material layer using a first etching gas, and stopping etching before the second dielectric film is exposed; and
    etching the second electrode material layer using a second etching gas until the second dielectric film is exposed.

5. The method of manufacturing a semiconductor device according to claim 4, wherein the first etching gas is one selected from the group consisting of HBr gas, a mixed gas containing HBr gas and $Cl_2$ gas, a mixed gas containing HBr gas, $N_2$ gas, and $CF_4$ gas, a mixed gas containing HBr gas, $N_2$ gas, and $NF_3$ gas, and a mixed gas containing HBr gas, $N_2$ gas, and $CHF_3$ gas.

6. The method of manufacturing a semiconductor device according to claim 4, wherein the second etching gas is one selected from the group consisting of HBr gas, a mixed gas containing HBr gas and $O_2$ gas, and a mixed gas containing HBr gas, $Cl_2$ gas, and $O_2$ gas.

7. The method of manufacturing a semiconductor device according to claim 1, wherein the second dielectric film is selected from the group consisting of a silicon oxide layer, a silicon nitride layer, a silicon oxynitride layer, and a combined layer formed by laminating at least two of a silicon oxide layer, a silicon nitride layer, and a silicon oxynitride layer.

8. The method of manufacturing a semiconductor device according to claim 7, wherein a third etching gas used to etch the second dielectric film is one selected from the group consisting of $CF_4$ gas, $SF_6$ gas, $NF_3$ gas, and $CHF_3$ gas.

9. The method of manufacturing a semiconductor device according to claim 1, wherein the first electrode material layer is formed of polycrystalline silicon or silicon germanium, to which an impurity is doped.

10. The method of manufacturing a semiconductor device according to claim 1, wherein the etching of the first electrode material layer includes:
etching the first electrode material layer using a fourth etching gas until the first dielectric film is exposed; and
removing a residue of the first electrode material layer using a fifth etching gas.

11. The method of manufacturing a semiconductor device according to claim 10, wherein the fourth etching gas is one selected from the group consisting of HBr gas, a mixed gas containing HBr gas and $O_2$ gas, and a mixed gas containing HBr gas, $Cl_2$ gas, and $O_2$ gas.

12. The method of manufacturing a semiconductor device according to claim 10, wherein the fifth etching gas is one selected from the group consisting of a mixed gas containing HBr gas and $O_2$ gas, a mixed gas containing HBr gas, $O_2$ gas, and $N_2$ gas, and a mixed gas containing HBr gas, $Cl_2$ gas, and $O_2$ gas.

13. The method of manufacturing a semiconductor device according to claim 1, further comprising removing a natural oxide layer formed on a surface of the second electrode material layer before the etching of the second electrode material layer.

14. The method of manufacturing a semiconductor device according to claim 1, wherein the second dielectric film is formed in contact with an upper surface of the first electrode material layer and the second electrode material layer is formed in contact with an upper surface of the second dielectric film.

15. The method of manufacturing a semiconductor device according to claim 1, wherein a distance between an upper surface of the first electrode material layer and a lower surface of the second electrode material layer is 5 Å to 100 Å.

16. A method of manufacturing a semiconductor device according to claim 1, wherein the first and second electrode material layers of the first stack film are formed of polycrystalline silicon or silicon germanium, the first and second electrode material layers of the first stack film being doped with a first impurity, and the first and second electrode material layers of the second stack film are formed of polycrystalline silicon or silicon germanium, the first and second electrode material layers of the second stack film being doped with a second impurity.

* * * * *